(12) United States Patent  
Brandt

(10) Patent No.: US 8,417,877 B2  
(45) Date of Patent: Apr. 9, 2013

(54) STRIPE-BASED NON-VOLATILE MULTILEVEL MEMORY OPERATION

(75) Inventor: Kevin R. Brandt, Boise, ID (US)

(73) Assignee: Micron Technology, Inc, Boise, ID (US)

( * ) Notice: Subject to any disclaimer, the term of this patent is extended or adjusted under 35 U.S.C. 154(b) by 233 days.

(21) Appl. No.: 12/872,969

(22) Filed: Aug. 31, 2010

(65) Prior Publication Data

US 2012/0054413 A1    Mar. 1, 2012

(51) Int. Cl.  
*G06F 12/00* (2006.01)
(52) U.S. Cl. .................. 711/103; 711/114; 714/758
(58) Field of Classification Search .................. None
See application file for complete search history.

(56) References Cited

U.S. PATENT DOCUMENTS

| | | | |
|---|---|---|---|
| 6,732,230 B1 | 5/2004 | Johnson et al. | |
| 7,380,157 B2 | 5/2008 | Brewer et al. | |
| 7,701,765 B2 | 4/2010 | Aritome | |
| 2002/0156971 A1 | 10/2002 | Jones et al. | |
| 2002/0161972 A1 | 10/2002 | Talagala et al. | |
| 2008/0158979 A1* | 7/2008 | Kamei et al. | 365/185.19 |
| 2008/0212372 A1 | 9/2008 | Hwang | |
| 2009/0129161 A1 | 5/2009 | Hwang | |
| 2009/0175075 A1 | 7/2009 | Yeh et al. | |
| 2010/0011158 A1* | 1/2010 | Shiraishi et al. | 711/103 |
| 2010/0017650 A1* | 1/2010 | Chin et al. | 714/6 |
| 2010/0161885 A1* | 6/2010 | Kanno et al. | 711/103 |
| 2010/0262762 A1* | 10/2010 | Borchers et al. | 711/103 |
| 2011/0040932 A1* | 2/2011 | Frost et al. | 711/103 |
| 2011/0044103 A1* | 2/2011 | Shiga | 365/185.03 |
| 2011/0060866 A1* | 3/2011 | Kawano et al. | 711/103 |
| 2011/0090734 A1* | 4/2011 | Burger et al. | 365/185.03 |
| 2011/0209028 A1* | 8/2011 | Post et al. | 714/758 |
| 2011/0214034 A1* | 9/2011 | Otsuka | 714/758 |
| 2011/0231732 A1* | 9/2011 | Chu | 714/763 |
| 2011/0296273 A1* | 12/2011 | Rub | 714/755 |
| 2012/0047409 A1* | 2/2012 | Post et al. | 714/718 |

OTHER PUBLICATIONS

International Search Report and Written Opinion for related PCT Application No. PCT/US2011/001519, Mailed Apr. 6, 2012, (9 pages).

* cited by examiner

*Primary Examiner* — Kaushikkumar Patel  
(74) *Attorney, Agent, or Firm* — Brooks, Cameron & Huebsch, PPLC

(57) ABSTRACT

Stripe-based non-volatile multilevel memory operation can include writing a number of lower stripes including programming a number of lower pages of information in each of the number of lower stripes. An upper stripe can be written including programming a number of upper pages of the information in the upper stripe. Each of the number of upper pages can correspond to a respective one of the number of lower pages. Each of the respective ones of the number of lower pages corresponding to the number of upper pages can be programmed in a different lower stripe of the number of lower stripes.

43 Claims, 8 Drawing Sheets

|  | CHANNEL 1 | CHANNEL 2 | CHANNEL 3 | CHANNEL 4 | CHANNEL 5 | CHANNEL 6 | CHANNEL 7 | CHANNEL 8 |
| --- | --- | --- | --- | --- | --- | --- | --- | --- |
| LOWER STRIPE 1 | LP 1 |  |  |  |  |  |  | PARITY 1 |
| LOWER STRIPE 2 |  | LP 2 |  |  |  |  |  | PARITY 2 |
| LOWER STRIPE 3 |  |  | LP 3 |  |  |  |  | PARITY 3 |
| LOWER STRIPE 4 |  |  |  | LP 4 |  |  |  | PARITY 4 |
| LOWER STRIPE 5 |  |  |  |  | LP 5 |  |  | PARITY 5 |
| LOWER STRIPE 6 |  |  |  |  |  | LP 6 |  | PARITY 6 |
| LOWER STRIPE 7 |  |  |  |  |  |  | LP 7 | PARITY 7 |
| UPPER STRIPE | UP 1 | UP 2 | UP 3 | UP 4 | UP 5 | UP 6 | UP 7 | PARITY U |

Fig. 5A

| 512B | CHANNEL 1 | CHANNEL 2 | CHANNEL 3 | CHANNEL 4 | CHANNEL 5 | CHANNEL 6 | CHANNEL 7 | CHANNEL 8 |
|---|---|---|---|---|---|---|---|---|
| LOWER STRIPE 1 | LP 1,1 | LP 1,2 | LP 1,3 | LP 1,4 | LP 1,5 | LP 1,6 | LP 1,7 | PARITY L1 |
| LOWER STRIPE 2 | PARITY L2 | LP 2,1 | LP 2,2 | LP 2,3 | LP 2,4 | LP 2,5 | LP 2,6 | LP 2,7 |
| LOWER STRIPE 3 | LP 3,7 | PARITY L3 | LP 3,1 | LP 3,2 | LP 3,3 | LP 3,4 | LP 3,5 | LP 3,6 |
| LOWER STRIPE 4 | LP 4,6 | LP 4,7 | PARITY L4 | LP 4,1 | LP 4,2 | LP 4,3 | LP 4,4 | LP 4,5 |
| LOWER STRIPE 5 | LP 5,5 | LP 5,6 | LP 5,7 | PARITY L5 | LP 5,1 | LP 5,2 | LP 5,3 | LP 5,4 |
| LOWER STRIPE 6 | LP 6,4 | LP 6,5 | LP 6,6 | LP 6,7 | PARITY L6 | LP 6,1 | LP 6,2 | LP 6,3 |
| LOWER STRIPE 7 | LP 7,3 | LP 7,4 | LP 7,5 | LP 7,6 | LP 7,7 | PARITY L7 | LP 7,1 | LP 7,2 |
| UPPER STRIPE 1 | UP 1,1 | UP 1,2 | UP 1,3 | UP 1,4 | UP 1,5 | UP 1,6 | UP 1,7 | PARITY U1 |
| UPPER STRIPE 2 | UP 2,1 | UP 2,2 | UP 2,3 | UP 2,4 | UP 2,5 | UP 2,6 | UP 2,7 | PARITY U2 |
| UPPER STRIPE 3 | UP 3,1 | UP 3,2 | UP 3,3 | UP 3,4 | UP 3,5 | UP 3,6 | UP 3,7 | PARITY U3 |
| UPPER STRIPE 4 | UP 4,1 | UP 4,2 | UP 4,3 | UP 4,4 | UP 4,5 | UP 4,6 | UP 4,7 | PARITY U4 |
| UPPER STRIPE 5 | UP 5,1 | UP 5,2 | UP 5,3 | UP 5,4 | UP 5,5 | UP 5,6 | UP 5,7 | PARITY U5 |
| UPPER STRIPE 6 | UP 6,1 | UP 6,2 | UP 6,3 | UP 6,4 | UP 6,5 | UP 6,6 | UP 6,7 | PARITY U6 |
| UPPER STRIPE 7 | UP 7,1 | UP 7,2 | UP 7,3 | UP 7,4 | UP 7,5 | UP 7,6 | UP 7,7 | PARITY U7 |

Fig. 5B

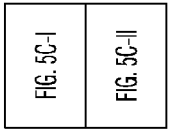

Fig. 5C

| FIG. 5C-I |
|---|
| FIG. 5C-II |

| | CHANNEL 1 | CHANNEL 2 | CHANNEL 3 | CHANNEL 4 | CHANNEL 5 | CHANNEL 6 | CHANNEL 7 | CHANNEL 8 |
|---|---|---|---|---|---|---|---|---|
| SCRATCH STRIPE 1 | LSP 1,1 | LSP 1,2 | LSP 1,3 | LSP 1,4 | LSP 1,5 | LSP 1,6 | LSP 1,7 | PARITY LS1 |
| SCRATCH STRIPE 2 | PARITY LS2 | LSP 2,1 | LSP 2,2 | LSP 2,3 | LSP 2,4 | LSP 2,5 | LSP 2,6 | LSP 2,7 |
| SCRATCH STRIPE 3 | LSP 3,7 | PARITY LS3 | LSP 3,1 | LSP 3,2 | LSP 3,3 | LSP 3,4 | LSP 3,5 | LSP 3,6 |
| SCRATCH STRIPE 4 | LSP 4,6 | LSP 4,7 | PARITY LS4 | LSP 4,1 | LSP 4,2 | LSP 4,3 | LSP 4,4 | LSP 4,5 |
| SCRATCH STRIPE 5 | LSP 5,5 | LSP 5,6 | LSP 5,7 | PARITY LS5 | LSP 5,1 | LSP 5,2 | LSP 5,3 | LSP 5,4 |
| SCRATCH STRIPE 6 | LSP 6,4 | LSP 6,5 | LSP 6,6 | LSP 6,7 | PARITY LS6 | LSP 6,1 | LSP 6,2 | LSP 6,3 |
| SCRATCH STRIPE 7 | LSP 7,3 | LSP 7,4 | LSP 7,5 | LSP 7,6 | LSP 7,7 | PARITY LS7 | LSP 7,1 | LSP 7,2 |
| SCRATCH STRIPE 8 | USP 1,1 | USP 1,2 | USP 1,3 | USP 1,4 | USP 1,5 | USP 1,6 | USP 1,7 | PARITY US1 |
| SCRATCH STRIPE 9 | PARITY US2 | USP 2,1 | USP 2,2 | USP 2,3 | USP 2,4 | USP 2,5 | USP 2,6 | USP 2,7 |
| SCRATCH STRIPE 10 | USP 3,7 | PARITY US3 | USP 3,1 | USP 3,2 | USP 3,3 | USP 3,4 | USP 3,5 | USP 3,6 |
| SCRATCH STRIPE 11 | USP 4,6 | USP 4,7 | PARITY US4 | USP 4,1 | USP 4,2 | USP 4,3 | USP 4,4 | USP 4,5 |
| SCRATCH STRIPE 12 | USP 5,5 | USP 5,6 | USP 5,7 | PARITY US5 | USP 5,1 | USP 5,2 | USP 5,3 | USP 5,4 |
| SCRATCH STRIPE 13 | USP 6,4 | USP 6,5 | USP 6,6 | USP 6,7 | PARITY US6 | USP 6,1 | USP 6,2 | USP 6,3 |
| SCRATCH STRIPE 14 | USP 7,3 | USP 7,4 | USP 7,5 | USP 7,6 | USP 7,7 | PARITY US7 | USP 7,1 | USP 7,2 |

Fig. 5C-I

| | 512C | 514C | | | | | | |
|---|---|---|---|---|---|---|---|---|
| LOWER STRIPE 1 | LP 1,1 | LP 1,2 | LP 1,3 | LP 1,4 | LP 1,5 | LP 1,6 | LP 1,7 | PARITY L1 |
| LOWER STRIPE 2 | PARITY L2 | LP 2,1 | LP 2,2 | LP 2,3 | LP 2,4 | LP 2,5 | LP 2,6 | LP 2,7 |
| LOWER STRIPE 3 | LP 3,7 | PARITY L3 | LP 3,1 | LP 3,2 | LP 3,3 | LP 3,4 | LP 3,5 | LP 3,6 |
| LOWER STRIPE 4 | LP 4,6 | LP 4,7 | PARITY L4 | LP 4,1 | LP 4,2 | LP 4,3 | LP 4,4 | LP 4,5 |
| LOWER STRIPE 5 | LP 5,5 | LP 5,6 | LP 5,7 | PARITY L5 | LP 5,1 | LP 5,2 | LP 5,3 | LP 5,4 |
| LOWER STRIPE 6 | LP 6,4 | LP 6,5 | LP 6,6 | LP 6,7 | PARITY L6 | LP 6,1 | LP 6,2 | LP 6,3 |
| LOWER STRIPE 7 | LP 7,3 | LP 7,4 | LP 7,5 | LP 7,6 | LP 7,7 | PARITY L7 | LP 7,1 | LP 7,2 |
| UPPER STRIPE 1 | UP 1,1 | UP 1,2 | UP 1,3 | UP 1,4 | UP 1,5 | UP 1,6 | UP 1,7 | PARITY U1 |
| UPPER STRIPE 2 | UP 2,1 | UP 2,2 | UP 2,3 | UP 2,4 | UP 2,5 | UP 2,6 | UP 2,7 | PARITY U2 |
| UPPER STRIPE 3 | UP 3,1 | UP 3,2 | UP 3,3 | UP 3,4 | UP 3,5 | UP 3,6 | UP 3,7 | PARITY U3 |
| UPPER STRIPE 4 | UP 4,1 | UP 4,2 | UP 4,3 | UP 4,4 | UP 4,5 | UP 4,6 | UP 4,7 | PARITY U4 |
| UPPER STRIPE 5 | UP 5,1 | UP 5,2 | UP 5,3 | UP 5,4 | UP 5,5 | UP 5,6 | UP 5,7 | PARITY U5 |
| UPPER STRIPE 6 | UP 6,1 | UP 6,2 | UP 6,3 | UP 6,4 | UP 6,5 | UP 6,6 | UP 6,7 | PARITY U6 |
| UPPER STRIPE 7 | UP 7,1 | UP 7,2 | UP 7,3 | UP 7,4 | UP 7,5 | UP 7,6 | UP 7,7 | PARITY U7 |

Lower stripes: 544C-L; Upper stripes: 544C-U

STRIPE-BASED NON-VOLATILE MULTILEVEL MEMORY OPERATION

TECHNICAL FIELD

The present disclosure relates generally to semiconductor memory devices, methods, and systems, and more particularly, to stripe-based non-volatile multilevel memory operation,

BACKGROUND

Memory devices are typically provided as internal, semiconductor, integrated circuits in computers or other electronic devices. There are many different types of memory including volatile and non-volatile memory. Volatile memory can require power to maintain its information and includes random-access memory (RAM), dynamic random access memory (DRAM), and synchronous dynamic random access memory (SDRAM), among others. Non-volatile memory can provide persistent information by retaining stored information when not powered and can include NAND flash memory, NOR flash memory, read only memory (ROM), Electrically Erasable Programmable ROM (EEPROM.), Erasable Programmable ROM (EPROM), phase change random access memory (PCRAM), resistive random access memory (RRAM), and magnetic random access memory (MRAM), such as spin torque transfer random access memory (STT RAM), among others.

Memory devices can be combined together to form a solid state drive (SSD). A solid state drive can include non-volatile memory, e.g., NAND flash memory and NOR flash memory, and/or can include volatile memory, e.g., DRAM and SRAM, among various other types of non-volatile and volatile memory. Flash memory devices, including floating gate flash devices and charge trap flash (CM devices using semiconductor-oxide-nitride-oxide-semiconductor and metal-oxide-nitride-oxide-semiconductor capacitor structures that store information in charge traps in the nitride layer, may be utilized as non-volatile memory for a wide range of electronic applications. Flash memory devices typically use a one-transistor memory cell that allows for high memory densities, high reliability, and low power consumption.

An SSD can he used to replace hard disk drives as the main storage device for a computer, as the solid state drive can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives. SSD manufacturers can use non-volatile flash memory to create flash SSDs that may not use an internal battery supply, thus allowing the drive to be more versatile and compact.

An SSD can include a number of memory devices, e.g., a number of memory chips (as used herein, "a number of" something can refer to one or more of such things, e.g., a number of memory devices can refer to one or more memory devices). As one of ordinary skill in the art will appreciate, a memory chip can include a number of dies and/or logical units (LUNs). Each die can include a number of memory arrays and peripheral circuitry thereon. The memory arrays can include a number of memory cells organized into a number of physical pages, and the physical pages can be organized into a number of blocks.

A redundant array of independent disks (RAID) is an umbrella term for computer information storage schemes that divide and/or replicate information among multiple memory devices. The multiple memory devices in a RAID array may appear to a user and the operating system of a computer as a single memory device, e.g., disk. Historically, a RAID operated with multiple hard disk drives (HDDs).

BRIEF DESCRIPTION OF THE DRAWINGS

FIG. 5A illustrates a table correlating lower page and upper page programming across a number of channels with a number of lower stripes and upper stripes in accordance with one or more embodiments of the present disclosure.

FIG. 5B illustrates a table correlating lower page and upper page programming across a number of channels with a number of lower stripes and upper stripes in accordance with one or more embodiments of the present disclosure.

FIG. 5C illustrates a table correlating lower page and upper page programming across a number of channels with a number of lower scratch stripes, upper scratch stripes, lower stripes, and upper stripes in accordance with one or more embodiments of the present disclosure.

DETAILED DESCRIPTION

Figure 1:
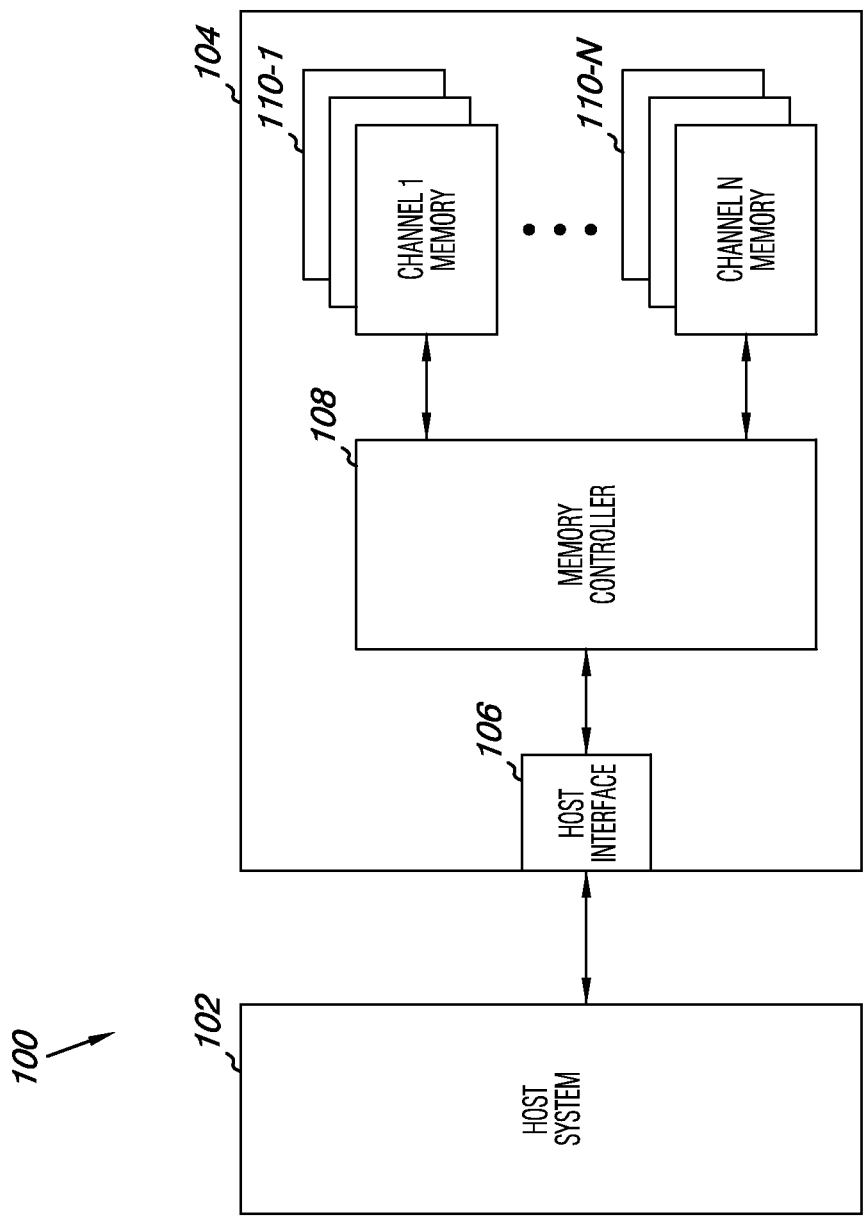
FIG. 1 is a functional block diagram of a computing system including at least one memory system in accordance with one or more embodiments of the present disclosure.

The present disclosure includes methods and devices for non-volatile multilevel stripe-based memory operation. One method embodiment includes writing a number of lower stripes including programming a number of lower pages of information in each of the number of lower stripes. An upper stripe can be written including programming a number of upper pages of information in the upper stripe. Each of the number of upper pages can correspond to a respective one of the number of lower pages. Each of the respective ones of the number of lower pages corresponding to the number of upper pages can be programmed being in a different lower stripe of the number of lower stripes. in the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "N," "M," "P," "R," and "S," particularly with respect to reference numerals in the drawings, indicates that a number of the particular feature so designated can be included with one or more embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 108 may reference element "08" in FIG. 1, and a similar element may be referenced as 208 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

FIG. 1 is a functional block diagram of a computing system 100 including at least one memory system 104, in accordance with one or more embodiments of the present disclosure. In the embodiment illustrated in FIG. 1, the memory system 104, e.g., a solid state drive (SSD), can include a host interface 106, a memory controller 108, e.g., memory control circuitry and/or memory control firmware, and one or more memory devices 110-1, . . . 110-N, e.g., solid state memory devices including non-volatile multilevel memory cells. The memory devices 110-1, . . . , 110-N can provide a storage volume for the memory system, e.g., with a file system formatted to the memory devices. In one or more embodiments, the memory controller 108 can be an application specific integrated circuit (ASIC) coupled to a printed circuit board including the physical host interface 106 and memory devices 110-1, . . . , 110-N.

As illustrated in FIG. 1, the memory controller 108 can be coupled to the host interface 106 and to the memory devices 110-1, . . . 110-N by a plurality of channels. The memory controller 108 can be configured to perform the operations described herein, in addition to other memory operations as will be appreciated by those skilled in the art. The host interface 106 can be used to communicate information between the memory system 104 and another device such as a host system 102. Host system 102 can include a memory access device, e.g., a processor. One of ordinary skill in the art will appreciate that "a processor" can intend one or more processors, such as a parallel processing system, a number of coprocessors, etc. Examples of host systems include laptop computers, personal computers, digital cameras, digital recording and playback devices, mobile telephones, PDAs, memory card readers, interface hubs, and the like. For one or more embodiments, the host interface 106 can be in the form of a standardized interface. For example, when the memory system 104 is used for information storage in a computing system 100, the physical host interface 106 can be a serial advanced technology attachment (SATA), peripheral component interconnect express (Pete), or a universal serial bus (USB), among other connectors and interfaces. In general, however, host interface 106 can provide an interface for passing control, address, information, and other signals between the memory system 104 and a host system 102 having compatible receptors for the host interface 106.

The memory controller 108 can include host interface circuitry that can be coupled to and/or incorporated with the host interface 106. The host interface circuitry can interface with the host system 102 through a number of layers, e.g., a physical layer, a link layer, and/or a transport layer. One of ordinary skill in the art will appreciate that the number of layers for a particular host interface can be defined by an interface standard such as serial advanced technology attachment (SATA), peripheral component interconnect express (PCIe), universal serial bus (USB), etc. As used herein, a transport layer can indicate at least a transport layer as part of a SATA standard and/or a transaction layer as part of a PCIe standard. One of ordinary skill in the art will appreciate that a transport layer according to a SATA standard can be analogous to a transaction layer according to a PCIe standard. Embodiments are not limited to a particular standard.

In general, the host interface circuitry can convert command packets received from the host system, e.g., from a PCIe bus, into command instructions for converting host-memory translation responses into host system commands for transmission to the requesting host. For example, the host interface circuitry can construct SATA command packets from PCIe based transaction layer packets. The host interface circuitry can be configured to receive information associated with a plurality of addresses from the host system 102.

The memory controller 108 can include host-memory translation circuitry configured to translate host addresses to memory addresses, e.g., addresses associated with a received command such as a read and/or write command. The host-memory translation circuitry might, for example, convert host sector read and write operations to commands directed to specific portions of the memory devices 110-1, . . . , 110-N. Each host operation can be translated into single or multi-sector memory device 110-1, . . . , 110-N operation. For example, host read and write commands can be translated into memory device 110-1, . . . , 110-N read and write commands. Although memory controller 108 is described herein, one or more embodiments of the present disclosure can be implemented via memory control firmware. Therefore, as used herein, "memory controller" is defined to include memory control circuitry and/or memory control firmware.

The host-memory translation circuitry can include first and/or second level error detection circuitry. Although referred to as error detection circuitry, the error detection circuitry can also perform error correction. First level error detection circuitry can be configured to apply error correction such as BCH error correction, as will be understood by one of ordinary skill in the art, to detect and/or correct errors associated with information stored in the memory devices 110-1, . . . , 110-N. For example, the first level error detection circuitry can provide 29 bits of error correction over a 1080-bit code word. The second level error detection circuitry can detect errors that are not correctable by the first level error detection, e.g., uncorrectable error correction code (UECC) errors, such as by determining that there are more than a threshold amount of correctable errors. As described in more detail herein, one or more embodiments of the present disclosure provide for correction of UECC errors encountered during writing of an upper stripe by recreating one or more lower stripes using parity information. Second level error detection circuitry can include RAID exclusive or (XOR) circuitry. The RAID XOR circuitry can calculate parity information based on information received from the host interface circuitry. For each bit written to a number of the memory devices 110-1, . . . , 110-N, a parity bit can be calculated by RAID XOR circuitry and written to a particular one of the memory devices 110-1, . . . , 110-N.

According to one or more embodiments of the present disclosure, write information can be striped across a plurality of channels to a number of solid state memory devices in a RAID operation. As one of ordinary skill in the art will appreciate, striping includes splitting information so that it is stored across a plurality of channels, for example on more that one device. The portions of the more than one device that store the split information are collectively referred to as a stripe. In contrast, mirroring can include storing duplicate copies of information on more than one device.

The memory controller 108 can maintain an LBA table and/or a block table. The LBA table can store the physical page address of pages in the one or more memory devices 110-1, . . . , 110-N and include corresponding logical addresses. The LBA table can be indexed by the LBA that is contained in an associated command, e.g., an associated SATA command. The LBA table can be used to look-up physical page addresses that correspond to logical block addresses where corresponding information can be stored. The block table can store information for erasable blocks in the one or more memory devices 110-1, . . . , 110-N. Information stored in the block table can include valid page information, erase count, and other status information. Information accessed from the block table can be indexed by physical block address.

The memory controller 108 can communicate with the memory devices 110-1, . . . , 110-N to read, write, and erase information, among other operations. Although the memory devices 110-1, . . . , 110-N are illustrated being coupled to a collective memory controller 108, one or more embodiments of the present disclosure can include a discrete non-volatile memory controller for each memory channel. A memory device 110-1, . . . , 110-N can include one or more arrays of memory cells, e.g., non-volatile memory cells. The arrays can be flash arrays with a NAND architecture, for example. In a NAND architecture, the control gates of memory cells of a "row" can be coupled with an access, e.g., word, line, while the memory cells can be coupled in series source to drain in a "string" between a select gate source transistor and a select gate drain transistor. The string can be connected to a data line, e.g., bit line, by the select gate drain transistor. The use of the terms "row" and "string" implies neither a linear nor an orthogonal arrangement of memory cells. As will be appreciated by those of ordinary skill in the art, the manner of connection of the memory cells to the bit lines and source lines depends on whether the array is a NAND architecture, a NOR architecture, or some other memory array architecture.

The memory devices 110-1, . . . , 110-N can include a number of memory cells that can be grouped. As used herein, a group can include one or more memory cells, such as a page, block, plane, die, an entire array, or other groups of memory cells. For example, some memory arrays can include a number of pages of memory cells that make up a block of memory cells. A number of blocks can be included in a plane of memory cells. A number of planes of memory cells can be included on a die. As an example, a 128 GB memory device can include 4314 bytes of information per page, e.g., 4096 bytes of write information plus 218 bytes of overhead information, 128 pages per block, 2048 blocks per plane, and 16 planes per device.

The embodiment of FIG. 1 can include additional circuitry that is not illustrated so as not to obscure embodiments of the present disclosure. For example, the memory system 104 can include address circuitry to latch address signals provided over I/O connections through I/O circuitry. Address signals can be received and decoded by a row decoder and a column decoder to access the memory devices 110-1, . . . , 110-N. It will be appreciated by those skilled in the art that the number of address input connections can depend on the density and architecture of the memory devices 110-1, . . . , 110-N.

Figure 2:
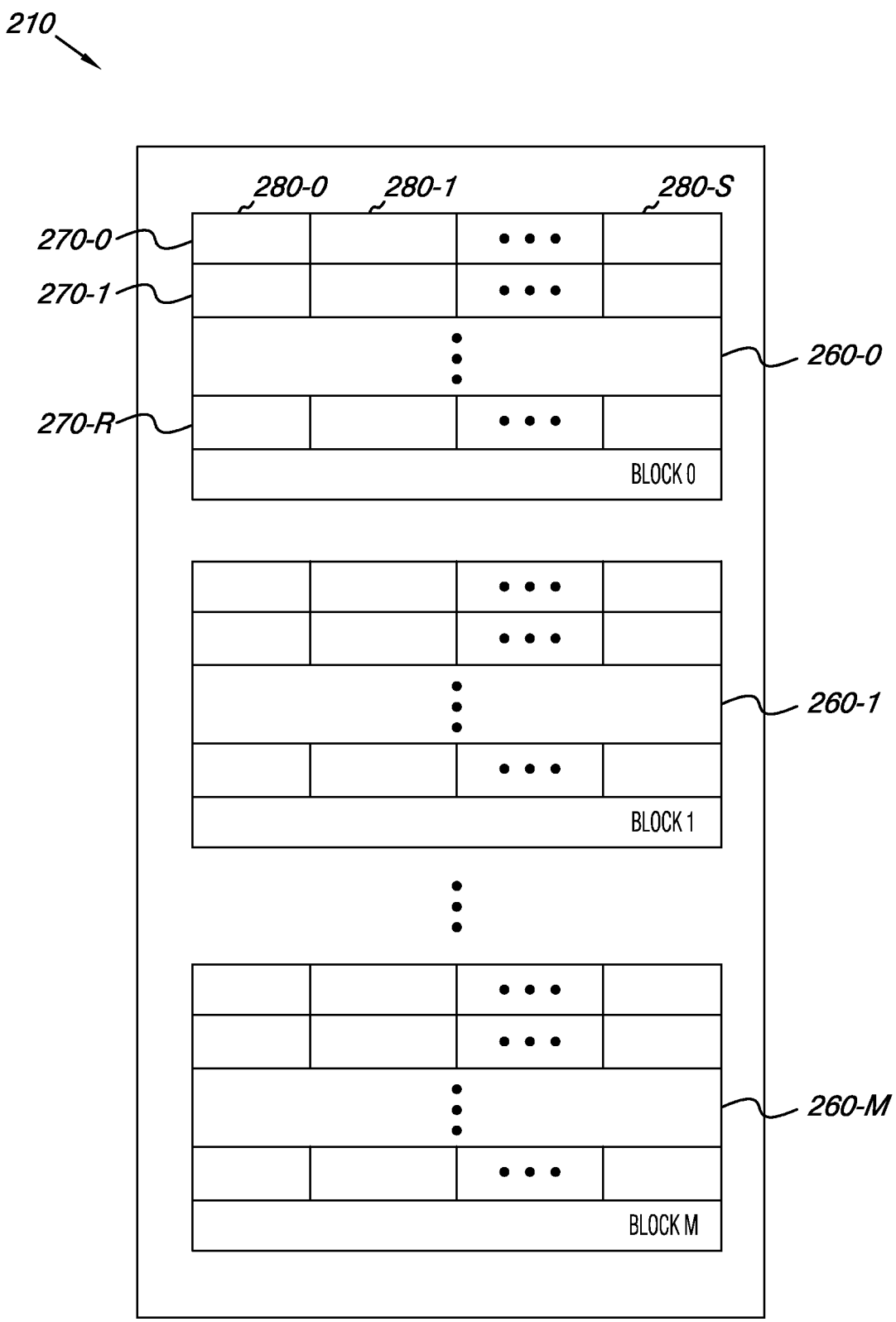
FIG. 2 illustrates a diagram of a portion of a memory device in accordance with one or more embodiments of the present disclosure.

FIG. 2 illustrates a diagram of a portion of a memory device 210 in accordance with one or more embodiments of the present disclosure. Although not shown in FIG. 2, one of ordinary skill in the art will appreciate that the memory device 210 can be located on a semiconductor die along with various peripheral circuitry associated with the operation thereof Memory device 210 can include one or more arrays of memory cells.

As shown in FIG. 2, memory device 210 can include a number of physical blocks 260-1 (BLOCK 1), 260-2 (BLOCK 2), . . . , 260-M. (BLOCK M) of memory cells. In the example shown in FIG. 2, the indicator "M" is used to indicate that the memory device 210 can include a number of physical blocks. As an example, the number of physical blocks in memory device 210 may be 128 blocks, 4,096 blocks, or 32,768 blocks, however embodiments are not limited to a particular number or multiple of physical blocks in a memory device. In the embodiment illustrated in FIG. 2, the memory device 210 can be, for example, a NAND flash memory device 210 such that, for example, the memory cells in each physical block 260-1, 260-2, . . . , 260-M can be erased together as a unit, e.g., the cells in each physical block can be erased in a substantially simultaneous manner. For instance, the cells in each physical block can be erased together in a single erasing operation.

Although not specifically designated as such in FIG. 2, a number of blocks can be used as scratch blocks. As described herein, programming a multilevel memory cell can include one or more lower page programming operations, e.g., to program the memory cell to an intermediate state, and an upper page programming operation, e.g., to program the memory cell to a final state. Scratch blocks can be useful to store information corresponding to the lower pages of information in the lower stripe and information corresponding to the upper pages of information in the upper stripe. That is, for a particular block of information, two scratch blocks can be used (one storing information corresponding to the lower pages of the particular block and one storing information corresponding to the upper pages of the particular block). However, embodiments are not limited to a scratch block storing only information corresponding to lower pages or upper pages, as the scratch block can store information corresponding to some lower pages and some upper pages. The two-to-one ratio of scratch blocks to particular blocks can arise from the notion that only lower pages of the scratch blocks are programmed as described in more detail herein. A block table can be updated such that one or more addresses associated with a scratch block e.g., a first scratch block storing information corresponding to lower pages of a particular block, can be linked to a second scratch block, e.g., storing information corresponding to upper pages of a particular block. The block table can be used to indicate that a scratch block can be erased after the corresponding information has been programmed to a particular block. Scratch blocks and associated operations are described in more detail with respect to FIGS. 4-5C.

The indicator "R" is used to indicate that a physical block, e.g., 260-1, 260-2, . . . , 260-M, can include a number of rows. In some embodiments, the number of rows, e.g., word lines, in each physical block can be 32, but embodiments are not limited to a particular number of rows 270-1, 270-2, . . . , 270-R per physical block. As one of ordinary skill in the art will appreciate, each row 270-1, 270-2, . . . , 270-R can include one or more physical pages, e.g., an even page and an odd page. A physical page refers to a unit of writing and/or reading, e.g., a number of cells that are written and/or read together or as a functional group of memory cells. Accordingly, an even page and an odd page can be written and/or read with separate writing and/or reading operations.

For embodiments including multilevel cells (MLC), a physical page can be logically divided into an upper page and one or more lower pages. For example, a memory cell storing two bits of information can contribute one bit to an upper page of information and one bit to a lower page of information. Thus a memory cell can be programmed to a data state of "01" where "0" corresponds to the lower page and "1" corresponds to the upper page. Programming such a memory cell can include lower page programming and upper page programming. Lower page programming can include programming the memory cell to an intermediate state and upper page programming can include programming the memory cell to a final state. The same is described in more detail in connection with FIG. 4. The logical upper page and logical lower page can be part of the same physical page. For ease of illustration, each row 270-1, 270-2, . . . , 270-R, in FIG. 2 includes only one physical and logical page, however embodiments are not so limited.

In one or more embodiments of the present disclosure, and as shown in FIG. 2, a page can store information in a number of sectors 280-1, 280-2, 280-S. The indicator "S" is used to indicate that a page can include a number of sectors. Information can include system and/or user data. Each sector 280-1, 280-2, . . . , 280-S can store system and/or user data and can include overhead information, such as error correction code (FCC) information, and logical block address (LBA) information. As one of ordinary skill in the art will appreciate, logical block addressing is a scheme that can be used by a host for identifying a sector of information, e.g., each sector can correspond to a unique LBA. In one or more embodiments, a sector is the smallest addressable portion of a storage volume. As an example, a sector of information can be a number of bytes of information, e.g., 256 bytes, 512 bytes, or 1,024 bytes. For example, an SSD can have 4, 8, or 16 sectors in a page, where a sector can be 512 bytes, and an SSD can have 128, 256, or 512 pages per physical block, therefore physical block sizes are 131072 bytes, 262144 bytes, and 524288 bytes. Embodiments are not limited to these examples.

It is noted that other configurations for the physical blocks 260-1, 260-2, . . . , 260-M, rows 270-1, 270-2, . . ., 270-R, sectors 280-1, 280-2, . . ., 280-S, and pages are possible. For example, the rows 270-1, 270-2, . . . , 270-R of the physical blocks 260-1, 260-2, . . . , 260-M can each store information corresponding to a single sector which can include, for example, more or less than 512 bytes of information.

Figure 3:
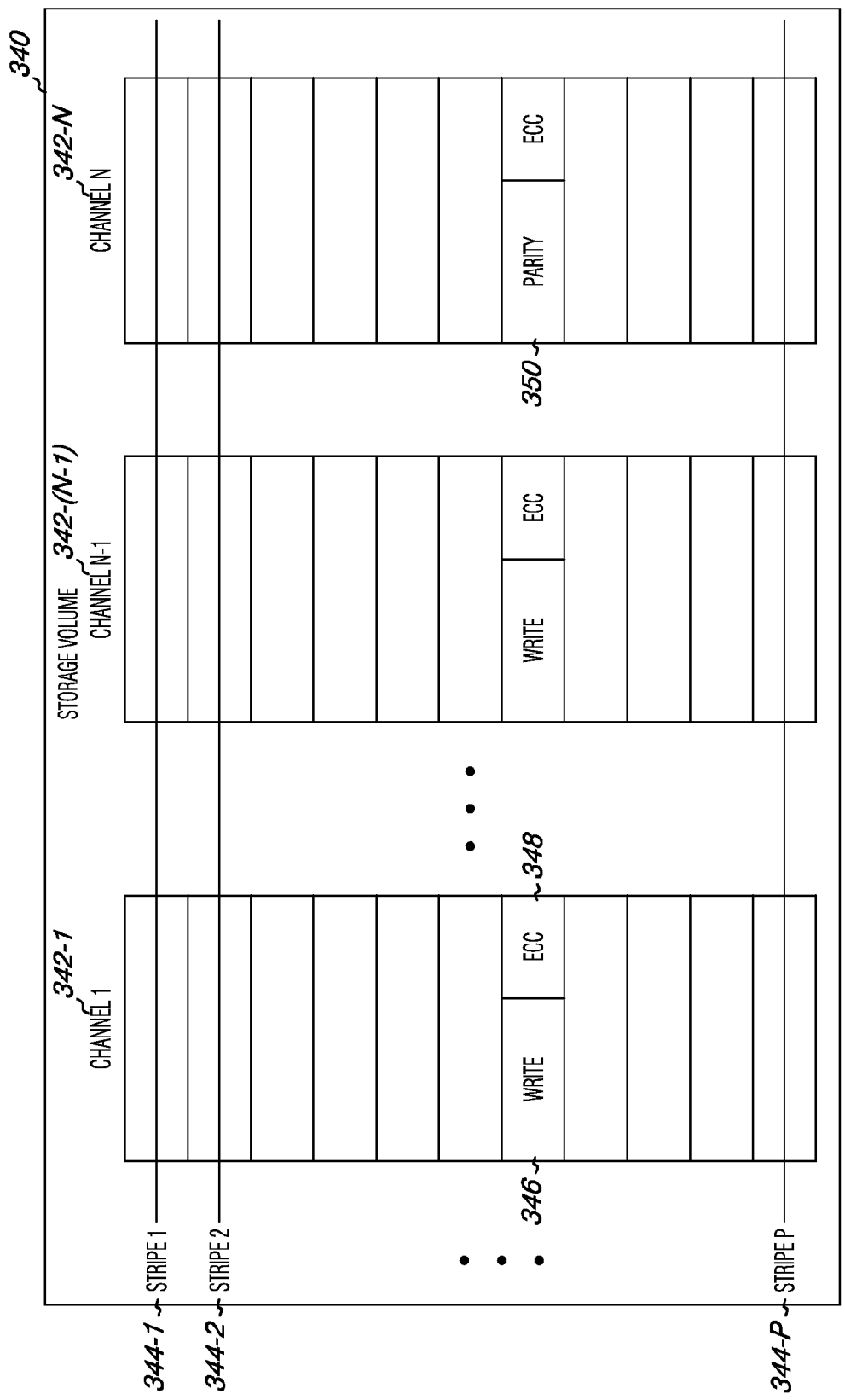
FIG. 3 illustrates a block diagram of a storage volume operated on a stripe-basis in accordance with one or more embodiments of the present disclosure.

FIG. 3 illustrates a block diagram of a storage volume 340 operated on a stripe-basis in accordance with one or more embodiments of the present disclosure. The storage volume 340 can be provided by a file system formatted to a number of solid state memory devices, e.g., solid state memory devices 110-1, . . . , 110-N in FIG. 1, in a memory system, e.g., memory system 104 in FIG. 1. As described herein, each solid state memory device can be associated with a memory channel 342-1, . . . , 342-(N-1), 342-N. However, embodiments are not limited to one channel per memory device, e.g., memory chip, as some embodiments may include multiple channels per device. One memory chip can be coupled to a memory controller by more than one channel, e.g., in the case of a memory chip including more than one physical plane of memory cells. Information can be written in a number of stripes 344-1, 344-2, . . . , 344-P across the storage volume 340 provided by the number of solid state memory devices.

A memory system can receive write information from a host system. The memory system, e.g., RAID XOR circuitry associated with memory controller 108 in FIG. 1, can calculate parity information for the write information. In one or more embodiments, the write information and parity information. can be striped. across the storage volume 340 such that write information can be written across a subset of the number of available channels, e.g., channels 342-1, . . . , 342-(N-1) and parity information can be written across a second subset of the number of available channels, e.g., channel 342-N. For example, a memory system can include eight channels where seven channels are used for writing write information and one channel is used for writing parity information. As described herein, parity information can be written across different channels for different stripes. Embodiments are not limited to using N-1 of N channels for write information and a single channel for parity information. According to one or more embodiments of the present disclosure, RAID structure and/or stripe size can be programmable options.

A RAID structure can represent an implementation of a RAID storage scheme devised to divide and/or replicate information across multiple memory devices. For example, information can be striped and/or mirrored across two or more devices. Striping can include dividing write information into fragments and storing at least one fragment in each of a number of memory devices. Mirroring can include redundantly storing a copy of write information in at least two memory devices. Both striping and mirroring can include the use of error detection. Parity information can be stored in the same memory devices as write information and/or in a separate device from the devices storing write information. According to one or more embodiments of the present disclosure, the particular RAID structure to be implemented by a memory system can be a programmable option.

As used herein, a stripe size can refer to the number of channels across which information is striped. According to one or more embodiments of the present disclosure, a stripe size for a memory system can be a programmable option such that any number of the channels available to the memory system can be used for a stripe. For example, a memory system including 32 channels and a number of corresponding memory devices can have any stripe size from 2 to 32 channels. Sonic embodiments can include logically segregating a non-volatile memory into at least two portions, each portion including a subset of the number of channels associated with the non-volatile memory. Such embodiments can include operating the non-volatile memory system on a stripe basis for each of the at least two portions independently. For example, a number of pages of write information and parity information can be written in each stripe, where a first stripe is written across only one subset of the number of channels of the memory system and a second stripe is written across only a different subset of the number of channels of the memory system. Furthermore, a stripe size can change during operation of the memory system. A block table can be used to keep track of which portions of the memory system correspond to which stripes.

Storing parity information can allow information associated with a lower stripe to be recreated in response to a UECC error associated with writing an upper stripe that includes at least one physical page of memory cells in common with the lower stripe. More specific examples are given. below with respect to FIGS. 5A-5C. A memory channel, a memory device, a block of memory, a page of memory, or another portion of a memory device could experience an uncorrectable error or other error. For example, a lower page of write information can be written in the first stripe 344-1 across channels 342-1, . . . , 342-(N-1). Parity information can be written in the first stripe 344-1 across channel 342-N. If the first channel 342-1 experiences an uncorrectable error or other error, e.g. in response to an upper page being written across channel 342-1 as part of writing an upper stripe, write information associated with channels up to 342-(N-1) and. parity information associated with channel 342-N can be used to recreate the lower page of information written across the first channel 342-1. Similar to the case of creating the parity information, the memory system, e.g., RAID XOR circuitry, can use parity information along with write information to calculate replacement information for information associated with a portion of the memory system that experiences an uncorrectable error or other error.

ECC circuitry associated with the memory controller 108 in FIG. 1 can calculate first level error correction information for fragments of write information and/or second level correction, e.g., parity, information stored in the memory devices. FIG. 3 includes an illustration of write information 346 and first level error correction. information 348 being stored in association with channels 342-1, . . . , 342-(N-1) and parity information 350 and first level error correction information 348 being stored in association with channel 342-N. When a stripe is written, both write information and error correction information can be written together. If an error is detected in information, whether write information or parity information, first level error correction information can be used in an attempt to correct the error before and/or without implementing a second level of error correction, e.g., the correction associated with parity information described above. A memory system may store sufficient first level error correction information to enable a threshold number of erroneous bits to be corrected. If an error is detected, e.g., a UECC error during a write operation, that includes more bit errors than are correctable with the first level error correction information, then the second level of error correction, e.g., using the parity information described above, may be implemented, e.g., the information associated with the error(s) may be recreated using parity information and a remainder of the write information.

Figure 4:
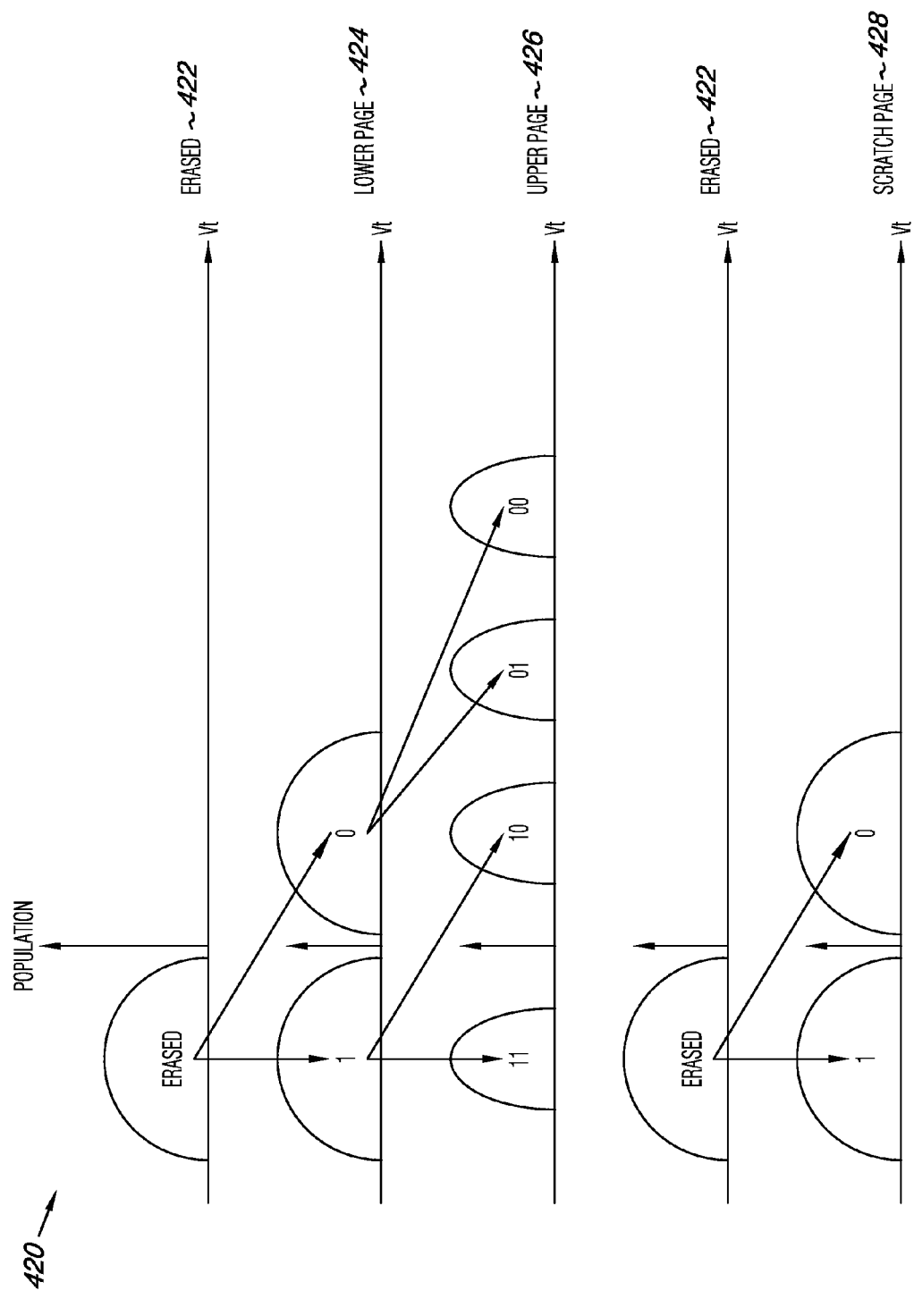
FIG. 4 illustrates a diagram of threshold voltage distributions associated with an example 2-bit memory cell for an erased state and a number of lower page, upper page, and scratch page data states in accordance with one or more embodiments of the present disclosure.

FIG. 4 illustrates a diagram of threshold voltage distributions 420 associated with an example 2-bit memory cell for an erased state 422 and a number of lower page 424, upper page 426, and scratch page 428 data states in accordance with one or more embodiments of the present disclosure. Embodiments are not limited to multilevel memory cells being programmed with two bits of information. One or more embodiments of the present disclosure can include a particular memory cell being programmed with more than two bits and/or a fractional number of bits of information.

Starting from an erased state 422, one or more programming pulses can be applied to a particular memory cell to program the cell to an intermediate state, e.g., 1 or 0, representing information from a lower page 424. Subsequently, one or more programming pulses can be applied to the particular memory cell to program the cell from the intermediate state, e.g., 1 or 0, to a final state, e.g., 11, 10, 01, or 00, representing date from an upper page 426. As illustrated in FIG. 4, for a 2-bit memory cell, information from the lower page 424 corresponding to the intermediate state can represent a first bit of information from the upper page 426 corresponding to the final state, e.g., the memory cell can be programmed from 1 to 11 or 10 or the memory cell can be programmed from 0 to 01 or 00. However, embodiments are not limited to 2-bit cells or to the particular information values illustrated in FIG. 4.

In one or more embodiments, a scratch page 428 of information can correspond to a lower page 424 or to an upper page 426 of write information. As illustrated in FIG. 4, such a scratch page can be similar to a lower page 424, e.g., a 2-bit cell can be programmed to one of two states as part of a scratch page 428 programming operation.

For a particular programming operation, a lower page 424 and a corresponding upper page 426 are programmed to the same physical memory cells, e.g., the same physical page of memory cells. However, when the particular programming operation includes programming of a number of scratch pages 428, the scratch pages are programmed to different physical memory cells, e.g., different physical pages of memory cells, than those programmed with the lower page and the upper page. In one or more embodiments, the scratch pages of memory cells can be in scratch blocks of memory cells, e.g., different physical blocks of memory cells than a block of memory cells including those programmed with the particular lower page and the particular upper page.

The scratch page 428 can be used to indicate how a lower page 424 or and upper page 426 is to be programmed. Information in the scratch page 428 can correspond to a lower page 424 or an upper page 426. Two scratch pages 428, e.g., a scratch page 428 corresponding to a lower page 424 and a scratch page 428 corresponding to an upper page 426 (separate physical pages of memory cells), can be combined to write the lower page 424 and the upper page 426 (where the lower page 424 and the upper page 426 are written in the same physical page of memory cells, different from the physical pages of memory cells for the two scratch pages 428).

For lower page 424 programming, a memory cell being programmed with information "1" as part of a scratch page 428 can indicate that a first bit of a lower page is "1" and/or that a corresponding memory cell should be programmed from an erased state 422 to a lower of two intermediate states in a lower page 424. For upper page 426 programming, a memory cell being programmed with information "1" as part of a scratch page 424 can indicate that a second bit of an upper page is "1" and/or that a corresponding memory cell from a lower page 424 should be programmed from an intermediate state to a lower of two final states associated with the intermediate state. For example, if the corresponding memory cell from the lower page 424 is programmed to intermediate state "1," as illustrated in FIG. 4, and the scratch page corresponding to the upper page includes information "1," then the corresponding memory cell from the lower page should be programmed to a final state of "11" in the upper page 426. Likewise, if the corresponding memory cell from the lower page 424 is programmed to an intermediate state "0," as illustrated in FIG. 4, and the scratch page corresponding to the upper page includes information "1," then the corresponding memory cell from the lower page 424 should be programmed to a final state of "01" in the upper page 426.

For lower page 424 programming, a memory cell being programmed with information "0" as part of a scratch page 424 can indicate that a first bit of a lower page is "0" and/or that a corresponding memory cell should be programmed from an erased state 422 to an upper of two intermediate states in a lower page 424. For upper page 426 programming, a memory cell being programmed with information "0" as part of a scratch page 424 can indicate that a second hit of an upper page is "0" and/or that a corresponding memory cell from a lower page 424 should be programmed from an intermediate state to an upper of two final states associated with the intermediate state. For example, if the corresponding memory cell from the lower page 424 is programmed to intermediate state "1," as illustrated in FIG. 4, and the scratch page corresponding to the upper page 426 includes information "0," then the corresponding memory cell from the lower page should be programmed to a final state of "10" in the upper page 426. Likewise, if the corresponding memory cell from the lower page 424 is programmed to an intermediate state "0," as illustrated in FIG. 4, and the scratch page corresponding to the upper page 426 includes information "0," then the corresponding memory cell from the lower page 424 should be programmed to a final state of "00" in the upper page 426.

As will be appreciated, methods for programming multi-level memory cells with a number of bits other than two can be extrapolated from the description herein. For example, a 4-bit memory cell can be programmed with two or more lower page programming operations before being programmed to a final state, and such embodiments can include the use of more than two scratch pages to indicate how a lower page should be programmed, how a subsequent lower page should be programmed, and/or how an upper page should be programmed, e.g., how a memory cell should be programmed to one or more intermediate states and/or to a final state. The one or more example embodiments described herein with a 2-bit cell are illustrative for purposes of explanation, and do not limit the present disclosure to operation of 2-bit memory cells. Furthermore, the use of "1s" and "0s" and the terms "upper" and "lower" are used herein to illustrate one or more example embodiments and are do not limit the present disclosure to a particular notation or information arrangement.

FIG. 5A illustrates a table correlating lower page and upper page programming across a number of channels 542A with a number of lower stripes 544A-L and upper stripes 544A-U in accordance with one or more embodiments of the present disclosure. According to one or more embodiments of the present disclosure, writing a number of lower stripes 544A-L can include programming a number of lower pages of information in each of the number of lower stripes 544A-L. Each of the number of lower pages can be programmed in a particular lower stripe substantially simultaneously across the number of channels 542A. In some embodiments, each of a number of lower stripes 544A-L can include only one lower page of information, e.g., write information, and only one page of parity information, although a particular lower stripe can include more than two pages. In FIG. 5A, for example, "Lower Stripe 1" includes lower page "LP 1" 512A written across "Channel 1" and "Parity 1" 550A written across "Channel 8." In some embodiments, the number of pages of the number of lower stripes 544A-L other than the lower page of user data and the page of parity information (shown in FIG. 5A as blank pages) can be reserved for system data. Parity information, e.g., a page 550A of parity information, can be calculated for a remainder of the pages in a lower stripe and can be programmed to one of the pages in a lower stripe. Embodiments are not limited to particular number of stripes and/or channels.

In one or more embodiments, writing an upper stripe 544A-U can include programming a number of upper pages of the information in the upper stripe 544A-U. Each of the number of upper pages in the upper stripe 544A-U can be programmed substantially simultaneously across the number of channels 542A. Each of the number of upper pages in the upper stripe corresponds to a respective one of the number of lower pages. In FIG. 5A, for example, "Upper Stripe" 544A-U includes upper page "UP 1" 514A corresponding to lower page "LP 1" 512A in "Lower Stripe 1." That is, writing the upper stripe 544A-U includes programming memory cells from the lower page 512A to the upper page 514A.

As is illustrated in FIG. 5A, each of the number of lower pages, e.g., "LP 1", "LP 2", "LP 3", "LP 4", "LP 5", "LP 6", and "LP 7", corresponding to a respective one of the number of upper pages, e.g., "UP 1", "UP 2", "UP 3", "UP 4", "UP 5", "UP 6", and "UP 7", can be written in a different lower stripe of the number of lower stripes 544A-L, e.g., each as part of a separate striping operation. Accordingly, even if memory cells associated with all of the pages of the upper stripe 544A-U experience a UECC error, e.g., if the information is corrupted, during writing of the upper stripe 544A-U, each of the corresponding lower pages can be recreated using parity information. For example, if memory cells associated with a particular lower page 512A experience a UECC error during writing of a corresponding upper page 514A, the lower page 512A can be recreated using a remainder of information in a stripe, e.g., "Lower Stripe 1," including the particular lower page and parity information 550A from the stripe. One example of such an error is asynchronous power cycling, e.g., an unintended interruption in power to one or more memory devices. Although FIG. 5A illustrates only one page 512A of information, e.g., write information, in "Lower Stripe 1," embodiments are not so limited, as described in more detail below with respect to FIGS. 5B-5C.

Each of the lower pages, e.g., page 512A, illustrated in FIG. 5A in association with each of the lower stripes 544A-L logically represents a separate physical page of memory cells in a memory device. Each of the upper pages, e.g., page 514A, illustrated in FIG. 5A in association with the upper stripe 544A-U logically represent a same physical page of memory cells as a corresponding lower page. For example, upper page "UP 1" 514A logically represents the same physical page of memory cells as lower page "LP 1" 512A.

FIG. 5B illustrates a table correlating lower page and upper page programming across a number of channels 542B with a number of lower stripes 544B-L and upper stripes 544B-U in accordance with one or more embodiments of the present disclosure. According to one or more embodiments of the present disclosure, writing a plurality of lower stripes 544B-L can include programming a plurality of lower pages of information in each of the plurality of lower stripes 544B-L. Programming the plurality of lower pages of information in each of the plurality of lower stripes 544B-L can include programming one page of parity information and programming a remainder of the plurality of lower pages with user data. Each page of parity information includes a designation of the stripe to which it corresponds. Thus, for example, the page of parity information 550B is designated "L1" indicating that it corresponds to Lower Stripe 1. For example, in FIG. 5B, "Lower Stripe 1" includes "Parity L1 " 550B written across "Channel 8" and a lower pages "LP 1,1" 51213 written across "Channel 1," "LP 1,2" written across "Channel 2," "LP 1,3" written across "Channel 3," "LP 1,4" written across "Channel 4," "LP 1,5" written across "Channel 5," "LP 1,6" written across "Channel 6," and "LP I ,7" written across "Channel 7." Each of the lower pages in a particular lower stripe can be written across a different channel 542B. In some embodiments, each of the lower pages in a particular lower stripe can be written substantially simultaneously across a number of channels.

In one or more embodiments, writing a plurality of upper stripes 544B-U can include programming a plurality of upper pages of the information in each upper stripe. Each of the plurality of upper pages in a particular one of the plurality of upper stripes corresponds to a respective lower page in a different one of the plurality of lower stripes. As illustrated in FIG. 5B, each lower page "LP" includes a designation of the lower stripe to which the lower page corresponds and a designation of the upper stripe to which the lower page corresponds. Thus, for example, lower page "LP 1,1" 512B includes the designation "1,1" indicating that it corresponds to lower stripe 1 and upper stripe 1. As is also illustrated in FIG. 5B, each tipper page "UP" includes a designation of the upper stripe to which the upper page corresponds and a designation of the lower stripe to which the upper page corresponds. For example, upper page "UP 1,1" 514B includes the designation "1,1" indicating that it corresponds to upper stripe 1 and to lower stripe 1. That is, programming upper page "UP 1,1" 514B includes programming the same memory cells associated with the lower page "LP 1,1" 512B. As another example, programming the upper page "UP 1,2" includes programming the memory cells associated with lower page "LP 2,1."

Accordingly, writing each upper stripe 544B-U includes programming a plurality of pages, each of which corresponds to a different lower stripe 544B-L. For example, writing "Upper Stripe 1" includes programming upper page "UP 1,1" 514B corresponding to lower page "LP 1,1" 512B from "Lower Stripe 1", programming "UP 1,2" corresponding to "LP 2,1" in "Lower Stripe 2," programming "UP 1,3" corresponding to "LP 3,1" in "Lower Stripe 3," programming "UP 1,4" corresponding to "LP 4,1" in "Lower Stripe 4," programming "UP 1,5" corresponding to "LP 5,1" in "Lower Stripe 5," programming "UP 1,6" corresponding to "LP 6,1" in "Lower Stripe 6," and programming "UP 1,7" corresponding to "LP 7,1" in "Lower Stripe 7." The parity information programmed with each upper stripe 544B-U can be independent of the parity information written with each of the lower stripes 544B-L because it can be calculated for the information written in the corresponding upper stripe 544B-U. Each of the upper pages in a particular upper stripe can be written across a different channel 542B. In some embodiments, each of the upper pages in a particular upper stripe can be written substantially simultaneously across a number of channels.

The plurality of lower stripes 544B-L and upper stripes 544B-U can be written in the order shown in FIG. 5B, starting with Lower Stripe 1 and continuing through Upper Stripe 7. As information corresponding to a plurality of upper stripes 544B-U can be written in a single lower stripe 544B-L, one or more embodiments can include buffering and/or caching information associated with the plurality of upper pages prior to writing the plurality of lower stripes 544B-L. Likewise, as information corresponding to a plurality of lower stripes 544B-L can be written in a single upper stripe 544B-U, one or more embodiments can include buffering information associated with the plurality of lower pages prior to writing a first one of the plurality of lower stripes 544B-L. Accordingly, a memory system can include a buffer to store information prior to writing upper and/or lower stripes. Such a buffer can include volatile and/or non-volatile memory. For ease of illustration, FIG. 5B appears to illustrate the plurality of lower stripes 544B-L grouped together logically and the plurality of upper stripes 544B-U grouped together logically, however embodiments are not so limited. For example, the plurality of lower pages 544B-L and the plurality of upper pages 544B-U can be mixed throughout a particular block and are not necessarily written in the order indicated in FIG. 5B, e.g., a particular stripe could include a number of lower pages and a number of upper pages.

FIG. 5C illustrates a table correlating lower page and upper page programming across a number of channels 542C with a number of lower scratch stripes 544C-LS, upper scratch stripes 544C-US, lower stripes 544C-L, and upper stripes 544C-U in accordance with one or more embodiments of the present disclosure. FIG. 5C is includes two drawing sheets labeled "FIG. 5C-I" and "FIG. 5C-II" for ease of readability and to comply with font size requirements. One or more embodiments can include programming the plurality of lower scratch pages, e.g., lower scratch page "LSP 1,1" 516C-L, to a plurality of first blocks. The plurality of upper scratch pages, e.g., upper scratch page "USP 1,1" 516C-U, can be programmed to second blocks, that is, blocks that are different than the first blocks. The plurality of lower pages, e.g., lower page "LP 1,1" 512C and the plurality of upper pages, e.g., upper page "UP 1,1" 514C can both be programmed to third blocks, that is, blocks that are different than the first and the second blocks. As described herein, for the third blocks, the plurality of lower pages can be programmed prior to programming the plurality of upper pages. Although the scratch stripes 544C-LS and 544C-US are illustrated as including only information corresponding to lower pages and to upper pages respectively, embodiments are not so limited. That is a particular scratch stripe could include information corresponding to one or more lower pages and to one or more upper pages.

The lower scratch stripes 544C-LS can be read prior to writing in the lower stripes 544C-L and the upper scratch stripes 544C-US can be read prior to writing in the upper stripes 544C-U. Information in respective pages of the lower scratch stripes 544C-LS can correspond to information in respective pages of the lower stripes 544C-L and information in respective pages of the upper scratch stripes 544C-US can correspond to information in respective pages of the upper stripes 544C-U. In one or more embodiments, the first and second blocks associated with lower scratch stripes 544C-LS and upper scratch stripes 544C-US can be erased after the lower stripes 544C-L and/or upper stripes 544C-U are written.

Furthermore, as information is written in scratch stripes in general, the memory system may not be "aware" of whether the information in a particular scratch stripe corresponds to lower bits or upper bits of corresponding lower stripes 544C-L or upper stripes 544C-U. The memory system may only be "aware" that the information being written in the scratch stripe is information to be later combined and written in a particular lower stripe 544C-L and/or upper stripe 544C-U, whether as lower bits or upper bits.

Each of the plurality of scratch pages corresponds to a different one of the plurality of lower pages and/or a different one of the plurality of upper pages written in the plurality of lower stripes 544C-L and/or the plurality of upper stripes 544C-U. For example, lower scratch page "LSP 1,1" 516C-L, corresponds to lower page "LP 1,1" 512C and upper scratch page "USP 1,1" 516C-U corresponds to upper page "UP 1,1" 514C. As described herein, a scratch page can be used to indicate how one of a corresponding lower page or a corresponding upper page is to be programmed. For example, lower scratch page "LSP 2,4" can indicate how lower page "LP 2,4" is to be programmed and upper scratch page "USP 2,4" can indicate how upper page "UP 4,2" is to be programmed, e.g., by performing upper page programming on the memory cells associated with lower page "LP 2,4".

As described above with respect to FIG. 5B, each lower page "LP" includes a designation of the lower stripe to which the lower page corresponds and a designation of the upper stripe to which the lower page corresponds. Thus, for example, lower page "LP 2,4" includes the designation "2,4" indicating that it corresponds to lower stripe 2 and upper stripe 4. As is also illustrated in FIG. 5C, each upper page "UP" includes a designation of the upper stripe to which the upper page corresponds and a designation of the lower stripe to which the upper page corresponds. For example, upper page "UP 4,2" includes the designation "4,2" indicating that it corresponds to upper stripe 4 and to lower stripe 2. Each lower scratch page "LSP" includes a designation matching a designation for a. corresponding lower page. Thus, for example, lower scratch page "LSP 2,4" includes the designation "2,4" indicating that it corresponds to lower page "LP 2,4" having the same designation "2,4." Each upper scratch page "USP" includes a designation matching a designation for a corresponding upper page. Thus, for example, upper scratch page "USP 2,4" includes the designation "2,4" indicating that it corresponds to upper page "UP 2,4" having the same designation "2,4." In other words, USP 2,4 includes information to be programmed in UP 2,4.

In one or more embodiments, programming a particular one of the plurality of lower pages can include programming non-volatile multilevel memory cells associated with the particular one of the plurality of lower pages to an intermediate state, e.g., lower page programming, according to a corresponding lower scratch page. For example, programming the memory cells associated with lower page "LP 1,1" 512C can include programming of the memory cells according to the corresponding lower scratch page "LSP 1,1" 516C-L. Programming a corresponding one of the plurality of upper pages can include programming the same non-volatile multilevel memory cells associated with the particular one of the plurality of lower pages to a final state. For example, programming lower page "LP 1,1," 512C can include programming memory cells associated with lower page "LP 1,1" 512C to an intermediate state and programming upper page "UP 1,1" 514C can include programming the same memory cells to a final state. Programming the same memory cells to the final state can include programming the same memory cells according to a corresponding upper scratch page. For example, programming the memory cells associated with lower page "LP 1,1" 512C to the upper page "UP 1,1" 514C can include further programming of the memory cells according to the corresponding scratch page "USP 1,1" 516C-U. Accordingly, some embodiments can include reading the corresponding lower or upper scratch page prior to programming the corresponding lower or upper page. Once the upper pages corresponding to the lower and/or upper scratch pages in a particular scratch block have been programmed, the scratch block can be erased and used as a new scratch block, used as a block for programming lower and/or upper pages, or used for other memory operations.

The plurality of lower scratch stripes 544C-LS, upper scratch stripes 544C-US, lower stripes 544C-L, and upper stripes 544C-U can be written in the order shown in FIG. 5C, starting with Scratch Stripe 1 through Scratch Stripe 14 and on to Lower Stripe 1 through Lower Stripe 7 and to Upper Stripe 1 through Upper Stripe 7, or in another order. However, as each of the plurality of upper stripes 544C-U include upper pages that correspond to at least one lower page in each of the plurality of lower stripes 544C-L and the plurality of upper scratch stripes 5440-US, the plurality of upper stripes 544C-U can be written after writing the plurality of lower stripes 544C-L and the plurality of upper scratch stripes 544C-US.

Conclusion

The present disclosure includes methods and devices for non-volatile multilevel stripe-based memory operation. One method embodiment includes writing a number of lower stripes including programming a number of lower pages of information in each of the number of lower stripes. An upper stripe can be written including programming a number of upper pages of the information in the upper stripe. Each of the number of upper pages can correspond to a respective one of the number of lower pages. Each of the respective ones of the number of lower pages corresponding to the number of upper pages can be programmed in a different lower stripe of the number of lower stripes.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. As used herein, the term "and/or" includes any and all combinations of one or more of the associated listed items.

As used herein, the term "and/or" includes any and all combinations of one or more of the associated listed items. As used herein the tarn "or," unless otherwise noted, means logically inclusive or. That is, "A or B" can include (only A), (only B), or (both A and B). In other words, "A or B" can mean "A and/or B" or "one or more of A and B."

It will be understood that, although the terms first, second, third, etc. may be used herein to describe various elements, these elements should not be limited by these terms. These terms are only used to distinguish one element from another element. Thus, a first element could be termed a second element without departing from the teachings of the present disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for stripe-based non-volatile multilevel memory operation, comprising:
    writing a number of lower stripes including programming a number of lower pages of information in each of the number of lower stripes; wherein writing the number of lower stripes includes programming only one lower page of write information and only one page of parity information per lower stripe, and wherein the number of pages per lower stripe is greater than two;
    writing an upper stripe including programming a number of upper pages of the information in the upper stripe, wherein each of the number of upper pages corresponds to a respective one of the number of lower pages; and
    wherein each of the respective ones of the number of lower pages corresponding to the number of upper pages is programmed in a different lower stripe of the number of lower stripes.

2. The method of claim 1, wherein programming the number of lower pages in a particular lower stripe includes programming second level error detection information in a particular one of the number of lower pages for a remainder of the number of lower pages in the particular lower stripe.

3. The method of claim 2, wherein programming the number of lower pages in the particular lower stripe includes programming write information in at least one of the remainder of the number of lower pages in the particular lower stripe.

4. The method of claim 2, wherein the method includes recreating the remainder of the number of lower pages of the particular lower stripe in response to an error during writing of the upper stripe.

5. The method of claim 4, wherein the error comprises asynchronous power cycling.

6. The method of claim 1, wherein writing the upper stripe includes programming each of the number of upper pages substantially simultaneously.

7. The method of claim 6, wherein writing a particular one of the number of lower stripes includes programming the number of lower pages in the particular one of the number of lower stripes substantially simultaneously.

8. The method of claim 1, wherein the method includes reserving the number of pages of the number of lower stripes other than the only one lower page of write information and the only one page of parity information for system data.

9. The method of claim 1, wherein writing a particular one of the number of lower stripes includes programming each of the respective number of lower pages of write information and the at least one page of parity information across a different channel.

10. The method of claim 9, wherein the method includes:
  logically segregating the non-volatile multilevel memory into at least two portions, each portion including a subset of a number of channels associated with the non-volatile multilevel memory; and
  operating the non-volatile multilevel memory on a stripe basis for each of the at least two portions independently.

11. A method of programming memory, the method comprising:
  striping first write information across a plurality of physical pages of memory cells in a plurality of first stripes; and
  striping second write information across a plurality of physical pages of memory cells in a second stripe, wherein the second stripe includes only one of the plurality of physical pages of memory cells that includes first write information in the plurality of first stripes.

12. The method of claim 11, wherein the plurality of physical pages of memory cells in the plurality of first stripes and the plurality of physical pages of memory cells in the second stripe are each logically divided into an upper page and a number of lower pages.

13. The method of claim 12, wherein the number of lower pages is one.

14. The method of claim 11, wherein the method includes:
  striping the first write information across a plurality of lower logical pages of memory cells; and
  striping the second write information across a plurality of upper logical pages of memory cells.

15. The method of claim 11, wherein striping first write information further includes programming second level error detection information in an additional physical page of memory cells in each stripe, and wherein each of the additional physical pages of memory cells is associated with a different channel.

16. A method of programming memory, the method comprising:
  programming lower page information across a plurality of physical pages of memory cells in a single lower stripe,
  wherein the lower page information written in the single lower stripe corresponds to a plurality of upper stripes to be written, and wherein parity information for the single lower stripe is calculated based only on the lower page information written in the single lower stripe; and
  writing the plurality of upper stripes, wherein writing the plurality of upper stripes includes programming upper page information across the plurality of physical pages of memory cells.

17. The method of claim 16, wherein programming the lower page information comprises programming each of the memory cells of the plurality of physical pages to a respective intermediate state; and
  wherein programming the upper page information comprises programming each of the memory cells of the plurality of physical pages to a respective final state.

18. A method of programming memory, the method comprising:
  writing a plurality of lower stripes, wherein writing the plurality of lower stripes includes programming lower page information across a plurality of physical pages of memory cells; and
  programming upper page information across a subset of the plurality of physical pages of memory cells in a single upper stripe, wherein the upper page information written in the single upper stripe corresponds to the plurality of lower stripes, and wherein parity information for the single upper stripe is calculated based only on the upper page information in the single upper stripe.

19. A method for stripe-based non-volatile multilevel memory operation, comprising:
  writing a plurality of lower stripes including programming a plurality of lower pages of information to a plurality of first blocks in each of the plurality of lower stripes;
  writing a plurality of upper stripes including programming a plurality of upper pages of the information in each upper stripe, wherein each of the plurality of upper pages in a particular one of the plurality of upper stripes corresponds to a respective lower page in a different one of the plurality of lower stripes; and
  writing a plurality of scratch stripes to a plurality of second blocks including programming a plurality of scratch pages across each of the plurality of scratch stripes, wherein each of the plurality of scratch pages corresponds to a different respective one of the plurality of lower pages.

20. The method of claim 19, wherein programming the plurality of lower pages of information in each of the plurality of lower stripes includes programming one page of parity information and programming a remainder of the plurality of lower pages with write information.

21. The method of claim 19, wherein:
  programming a particular one of the plurality of lower pages includes programming non-volatile multilevel memory cells associated with the particular one of the plurality of lower pages to an intermediate state; and
  programming a corresponding one of the plurality of upper pages includes programming the non-volatile multilevel memory cells associated with the particular one of the plurality of lower pages to a final state.

22. The method of claim 21, wherein programming the corresponding one of the plurality of upper pages includes programming the non-volatile multilevel memory cells associated with the particular one of the plurality of lower page to the final state according to a corresponding scratch page.

23. The method of claim 22, wherein the method includes:
reading the corresponding scratch page prior to programming the corresponding one of the plurality of upper pages; and
erasing a particular one of the plurality of second blocks corresponding to the corresponding scratch page after programming the corresponding one of the plurality of upper pages.

24. The method of claim 19, wherein the method includes buffering information associated with the plurality of upper pages prior to writing of the plurality of lower stripes.

25. A memory system, comprising:
a number of memory devices including non-volatile multilevel memory cells;
a memory controller coupled to the number of memory devices by a plurality of channels, wherein the memory controller is configured to:
write a number of lower stripes, each of the number of lower stripes including a number of lower pages of information; and
write an upper stripe including a number of upper pages of the information, wherein each of the number of upper pages corresponds to a respective one of the number of lower pages, wherein each of the number of lower pages corresponding to respective ones of the number of upper pages is programmed to a different lower stripe of the number of lower stripes.

26. The memory system of claim 25, wherein the memory controller is configured to program each of the number of lower pages in a particular one of the number of lower pages stripes across a different one of the plurality of channels.

27. The memory system of claim 25, wherein the memory controller is configured to program each of the number of upper pages in the upper stripe across a different one of the plurality of channels.

28. The memory system of claim 25, wherein the memory controller is configured to program each of the number of lower pages corresponding to the number of upper pages to a different lower stripe of the number of lower stripes as part of a separate striping operation.

29. The memory system of claim 25, wherein the memory controller is coupled to a host interface, and wherein the memory controller is configured to receive information from the host interface and stripe the information across the plurality of channels to the number of memory devices.

30. The memory system of claim 25, wherein a stripe size comprises the number of the plurality of channels across which the number of lower stripes and the upper stripe are written, and wherein the memory controller is configured to control the stripe size as a programmable option.

31. A memory system, comprising:
a number of memory devices including non-volatile multilevel memory cells;
a memory controller coupled to the number of memory devices by a plurality of channels, wherein the memory controller is configured to:
write a plurality of lower stripes including programming a plurality of lower pages of information in each of the plurality of lower stripes; and
write a plurality of upper stripes including programming a plurality of upper pages of the information in each upper stripe, wherein each of the plurality of upper pages in a particular one of the plurality of upper stripes corresponds to a particular lower page in a different one of the plurality of lower stripes;
wherein parity information for a particular stripe is calculated based only on upper page information or lower page information in the particular stripe.

32. The memory system of claim 31, wherein the memory system is configured to buffer the plurality of lower pages associated with each of the plurality of lower stripes prior to writing a first one of the plurality of lower stripes.

33. The memory system of claim 31, wherein the memory system is configured to buffer or cache information associated with the plurality of upper pages prior to writing the plurality of lower stripes.

34. The memory system of claim 31, wherein the memory controller is configured to:
write a plurality of scratch stripes in a plurality of first blocks, each of the plurality of scratch stripes corresponding to one of the plurality of lower stripes or to one of the plurality of upper stripes;
write the plurality of lower stripes in a plurality of second blocks after writing the plurality of scratch stripes; and
write the plurality of upper stripes in the plurality of first blocks after writing the plurality of lower stripes and the plurality of scratch stripes.

35. The memory system of claim 34, wherein each of the plurality of scratch stripes includes a plurality of scratch pages, and wherein the plurality of scratch pages in a particular scratch stripe correspond to one of:
the plurality of lower pages in a particular lower stripe; and
the plurality of upper pages in a particular upper stripe.

36. The memory system of claim 34, wherein each of the plurality of scratch stripes includes a plurality of scratch pages of information indicating, and wherein a particular one of the plurality of scratch pages indicates one of:
how a particular lower page is to be programmed; and
how a particular upper page is to be programmed.

37. The memory system of claim 34, wherein the memory controller is configured to read a particular one of the plurality of scratch stripes prior to writing a corresponding one of the plurality of lower stripes or a corresponding one of the plurality of upper stripes.

38. The memory system of claim 37, wherein the memory controller is configured to erase the plurality of first blocks after writing the plurality of upper stripes.

39. A memory system, comprising:
a number of memory devices including non-volatile multilevel memory cells;
a memory controller coupled to the number of memory devices by a plurality of channels, wherein the memory controller is configured to:
write a plurality of scratch stripes in a plurality of first blocks, each of the plurality of scratch stripes corresponding to one of a plurality of lower stripes or to one of a plurality of upper stripes;
write the plurality of lower stripes in a plurality of second blocks after writing the plurality of scratch stripes including programming a plurality of lower pages of information in each of the plurality of lower stripes; and
write the plurality of upper stripes in the plurality of first blocks after writing the plurality of lower stripes and the plurality of scratch stripes including programming a plurality of upper pages of the information in each upper stripe, wherein each of the plurality of upper pages in a particular one of the plurality of upper stripes corresponds to a particular lower page in a different one of the plurality of lower stripes.

40. The memory system of claim 39, wherein each of the plurality of scratch stripes includes a plurality of scratch pages, and wherein the plurality of scratch pages in a particular scratch stripe correspond to one of:
the plurality of lower pages in a particular lower stripe; and
the plurality of upper pages in a particular upper stripe.

41. The memory system of claim 39, wherein each of the plurality of scratch stripes includes a plurality of scratch pages of information indicating, and wherein a particular one of the plurality of scratch pages indicates one of:
how a particular lower page is to be programmed; and
how a particular upper page is to be programmed.

42. The memory system of claim 39, wherein the memory controller is configured to read a particular one of the plurality of scratch stripes prior to writing a corresponding one of the plurality of lower stripes or a corresponding one of the plurality of upper stripes.

43. The memory system of claim 42, wherein the memory controller is configured to erase the plurality of first blocks after writing the plurality of upper stripes.

* * * * *

UNITED STATES PATENT AND TRADEMARK OFFICE
CERTIFICATE OF CORRECTION

PATENT NO. : 8,417,877 B2
APPLICATION NO. : 12/872969
DATED : April 9, 2013
INVENTOR(S) : Kevin R. Brandt Page 1 of 1

It is certified that error appears in the above-identified patent and that said Letters Patent is hereby corrected as shown below:

Title Page, Item (74), under "Attorney, Agent, or Firm", column 2, line 2, delete "PPLC" and insert -- PLLC --, therefor.

In the Claims:

In column 18, line 28, in Claim 18, delete "whereinparity" and insert -- wherein parity --, therefor.

Signed and Sealed this
Eleventh Day of June, 2013

Teresa Stanek Rea
*Acting Director of the United States Patent and Trademark Office*